US009831136B2

(12) United States Patent
Strocchia-Rivera

(10) Patent No.: US 9,831,136 B2
(45) Date of Patent: Nov. 28, 2017

(54) FILM THICKNESS METROLOGY

(71) Applicant: International Business Machines Corporation, Armonk, NY (US)

(72) Inventor: Carlos Strocchia-Rivera, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/840,540

(22) Filed: Aug. 31, 2015

(65) Prior Publication Data
US 2015/0371981 A1    Dec. 24, 2015

Related U.S. Application Data

(60) Continuation of application No. 14/505,274, filed on Oct. 2, 2014, now Pat. No. 9,224,661, which is a division of application No. 13/738,194, filed on Jan. 10, 2013, now Pat. No. 9,263,348.

(51) Int. Cl.
*H01L 27/02* (2006.01)
*H01L 29/06* (2006.01)
*H01L 21/306* (2006.01)
*H01L 21/66* (2006.01)

(52) U.S. Cl.
CPC ........ *H01L 22/12* (2013.01); *H01L 21/30604* (2013.01); *H01L 22/20* (2013.01); *H01L 27/0203* (2013.01); *H01L 29/06* (2013.01)

(58) Field of Classification Search
CPC ................. H01L 22/12; H01L 27/0203; H01L 21/30604
USPC .......................................................... 257/622
See application file for complete search history.

(56) References Cited

U.S. PATENT DOCUMENTS

| 5,342,808 | A | * | 8/1994 | Brigham ............. H01L 21/0337 257/E21.038 |
| 5,594,245 | A | | 1/1997 | Todokoro et al. |
| 5,953,579 | A | | 9/1999 | Lee et al. |
| 6,570,157 | B1 | | 5/2003 | Singh et al. |
| 7,049,157 | B2 | | 5/2006 | Lu et al. |
| 7,500,397 | B2 | | 3/2009 | Weigel et al. |
| 7,833,957 | B2 | | 11/2010 | Itano et al. |
| 8,163,657 | B2 | | 4/2012 | Chou et al. |
| 2005/0224995 | A1 | | 10/2005 | Lee et al. |

(Continued)

FOREIGN PATENT DOCUMENTS

JP    2011191296 A    9/2011

OTHER PUBLICATIONS

Zhang, "Mining Diagnostic Information from CD-SEM for Photolithography Control," 1998, 1 page, retrieved from: http://www.eecs.berkeley.edu/IPRO/Summary/Old.summaries/98abstracts/haolin.1.html.

(Continued)

*Primary Examiner* — Moazzam Hossain
(74) *Attorney, Agent, or Firm* — Bryan Bortnick; Hoffman Warnick LLC

(57) ABSTRACT

Methods for determining a target thickness of a conformal film with reduced uncertainty, and an integrated circuit (IC) chip having a conformal film of the target thickness are provided. In an embodiment, a first critical dimension of a structure disposed on a wafer is measured. Said structure has at least one vertical surface. A first conformal film is deposited over the structure covering each of a horizontal and the vertical surface of the structure. A second critical dimension of the covered structure is then measured. The target thickness of the conformal film is determined based on difference between the first CD measured on the structure and the second CD measured on the covered structure.

14 Claims, 8 Drawing Sheets

(56) References Cited

U.S. PATENT DOCUMENTS

| | | | | |
|---|---|---|---|---|
| 2008/0319709 | A1* | 12/2008 | Kurihara | H01L 22/12 702/155 |
| 2011/0014726 | A1* | 1/2011 | Yu | H01L 21/76229 438/8 |
| 2012/0150330 | A1* | 6/2012 | Lee | G05B 19/41875 700/104 |
| 2013/0316470 | A1* | 11/2013 | Zhou | H01L 22/26 438/8 |
| 2013/0330924 | A1* | 12/2013 | Olsen | H01L 22/26 438/667 |
| 2015/0014821 | A1 | 1/2015 | Strocchia-Rivera | |

OTHER PUBLICATIONS

Dziura et al., "Measurement of High-K and Metal Film Thickness on FinFET Sidewalls Using Scatterometry," 2008, pp. 1-8, Metrology, Inspection, and Process Control for Microlithography XXII, Proc. of SPIE vol. 6922, 69220V, 2008 SPIE Digital Library.

ITRS, "International Technology Roadmap for Semiconductors," 2011 Edition, Metrology, pp. 1-34.

Hossain, Moazzam, U.S. Appl. No. 13/738,194, Office Action, dated May 9, 2014, 17 pages.

Hossain, Maozzam, U.S. Appl. No. 13/738,194, Final Office Action, dated Nov. 10, 2014, 19 pages.

Hossain, Moazzam, U.S. Appl. No. 13/738,194, Office Action, dated May 15, 2015, 33 pages.

Hossain, Moazzam, U.S. Appl. No. 14/505,274, Notice of Allowance, dated Aug. 19, 2015, 21 pages.

Hossain, Moazzam, U.S. Appl. No. 14/505,274, Office Action, dated Dec. 19, 2014, 25 pages.

Staudt, "Estimation of Uncertainty in Plate Thickness Measurement by X-ray Fluorescence Spectrometry", Nov. 1993, pp. 85-97, vol. 3., AMP Journal of Technology.

Hossain, Notice of Allowance and Fee(s) Due for U.S. Appl. No. 13/738,194 dated Oct. 26, 2015, 11 pages.

* cited by examiner

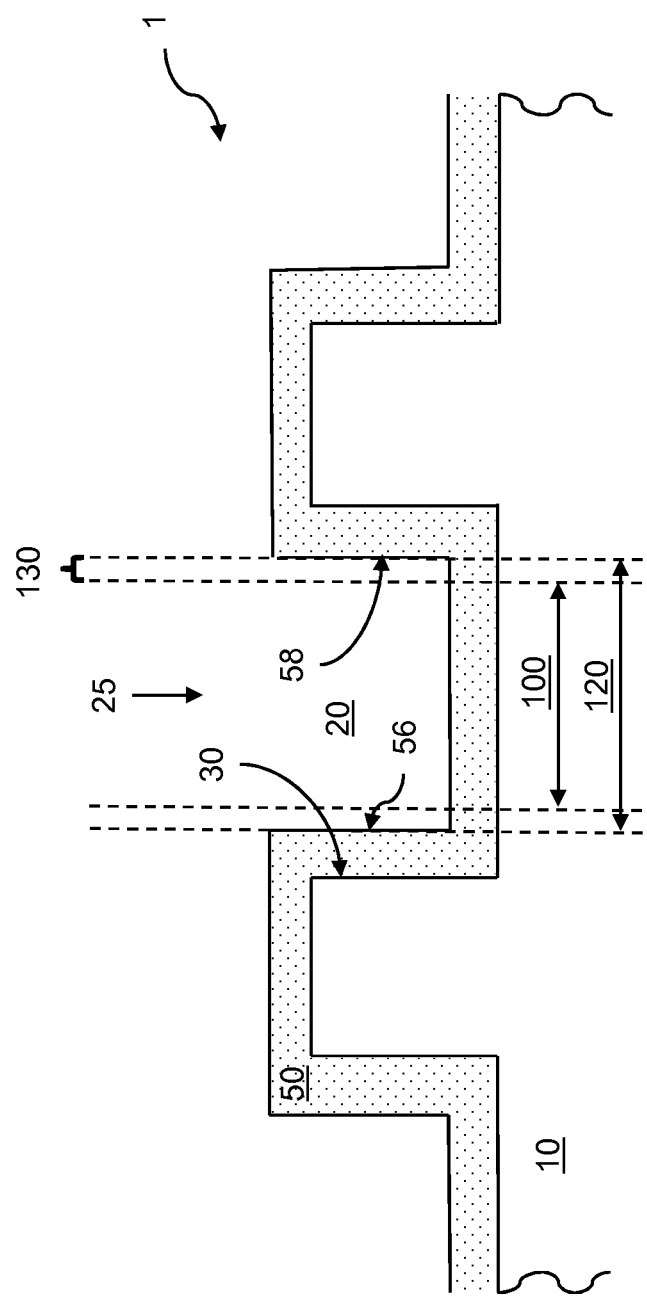

FILM THICKNESS METROLOGY

FIELD

The disclosure relates generally to production of integrated circuit chips, and more particularly to controlling film thickness on vertical sidewalls of features of IC chips.

BACKGROUND

Integrated circuit (IC) chip production is challenged by complex three-dimensional structures and films associated with these structures. Controlling film thickness on sidewalls of vertical surfaces of structures is crucial to proper operation of integrated circuits.

Optical techniques such as scatterometry have been used to assess sidewall film thickness. Scatterometry requires accurate and time-consuming modeling of an entire complex three-dimensional structure in order to achieve accurate measurements of sidewall film thickness. Moreover, accuracy can only be attained if most or all other parameters are tightly controlled, and measurement devices are calibrated according to the specific set of parameters. Such parameters include, for example, the composition of all films, surface roughness, feature morphology/shape, etc. This is due to the complex signature of the reflected signal. Even with tight control of the features, it remains difficult to reliably tease out an accurate film thickness measurement from the scatterometry signal. The utility of scatterometry methods are particularly limited in production mode.

Other techniques to assess sidewall film thickness include scanning electron microscopy (SEM) or transmission electron microscopy (TEM). However, taking cross sections to perform these techniques is destructive to the IC chip, and therefore substantially incompatible with use in production mode. It is also slow to perform, and produces a limited quantity of data.

BRIEF DESCRIPTION

Aspects of the invention provide a method of determining a target thickness for a conformal film disposed over a structure having at least one vertical sidewall on an IC chip, and an IC chip having a conformal film of the determined target thickness.

A first aspect of the disclosure provides a method including: measuring a first critical dimension (CD) of a structure disposed on a wafer, the structure having at least one vertical surface; depositing a first conformal film over the structure to form a coated structure, wherein the first conformal film covers each of a horizontal and the vertical surfaces of the structure; measuring a second CD of the coated structure; and determining a target first conformal film thickness based on a difference between the first CD and the second CD.

A second aspect of the disclosure provides a method including: depositing a first conformal film over a wafer having a structure thereon, thereby forming a coated structure, the structure including at least one vertical surface and at least one horizontal surface; measuring a first critical dimension (CD) of the structure; performing an etch to remove a partial thickness of the first conformal film from each of the at least one vertical surface and at least one horizontal surface; measuring a second CD of the coated structure; and determining a target first conformal film thickness based on a difference between the first CD and the second CD.

A third aspect of the disclosure provides an integrated circuit (IC) chip including: a wafer; at least one structure having at least one vertical surface, the at least one structure being formed on the wafer; and a first conformal film deposited over the wafer including the at least one structure, wherein the first conformal film has a first target thickness, and wherein the first target thickness is represented by the equation: $t = \frac{1}{2} [CD1 - CD2]$. In this equation, t=the first target thickness; CD1=a first critical dimension (CD); and CD2=a second CD.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

FIGS. 7-8 show an IC chip in various steps in a method in accordance with an embodiment of the invention.

DETAILED DESCRIPTION

As indicated above, aspects of the invention provide a method for determining a target thickness for a conformal film disposed over at least one three-dimensional feature on an IC chip, as well as an IC chip having a conformal film of a target thickness disposed thereon.

Figure 1:
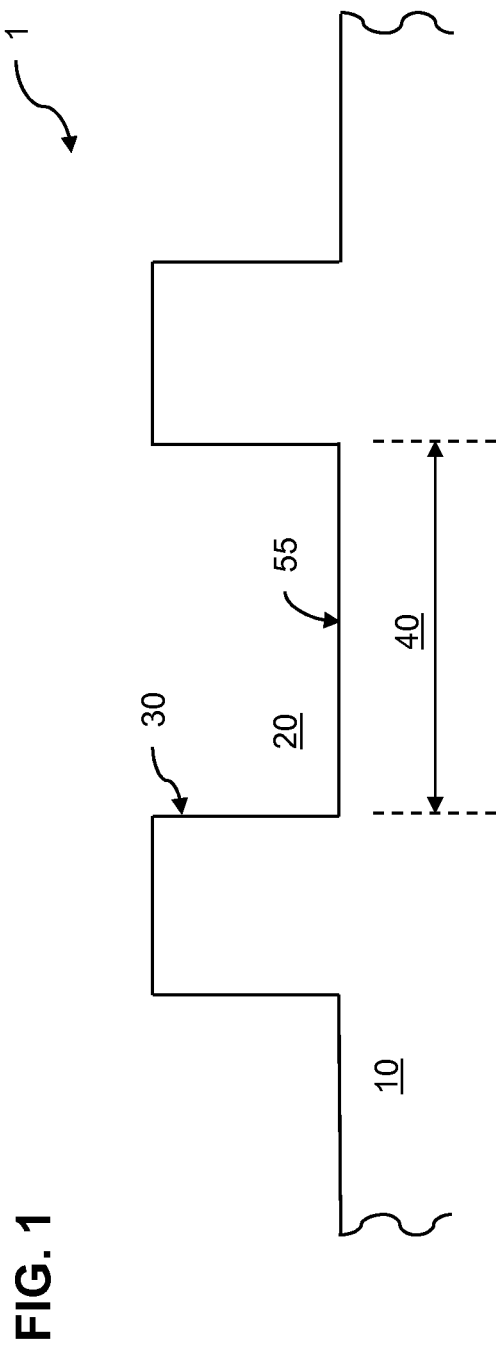
FIGS. 1-3 show an illustrative IC chip in various steps in a method in accordance with an embodiment of the invention.
Figure 2:
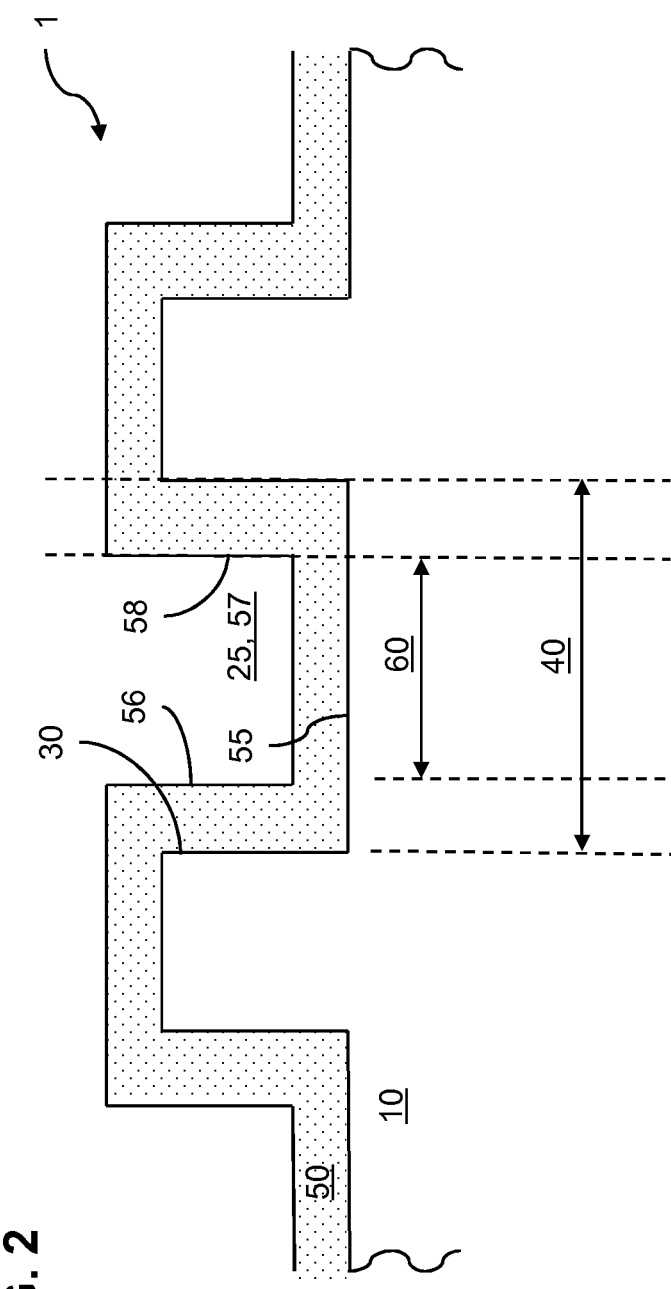
Figure 3:
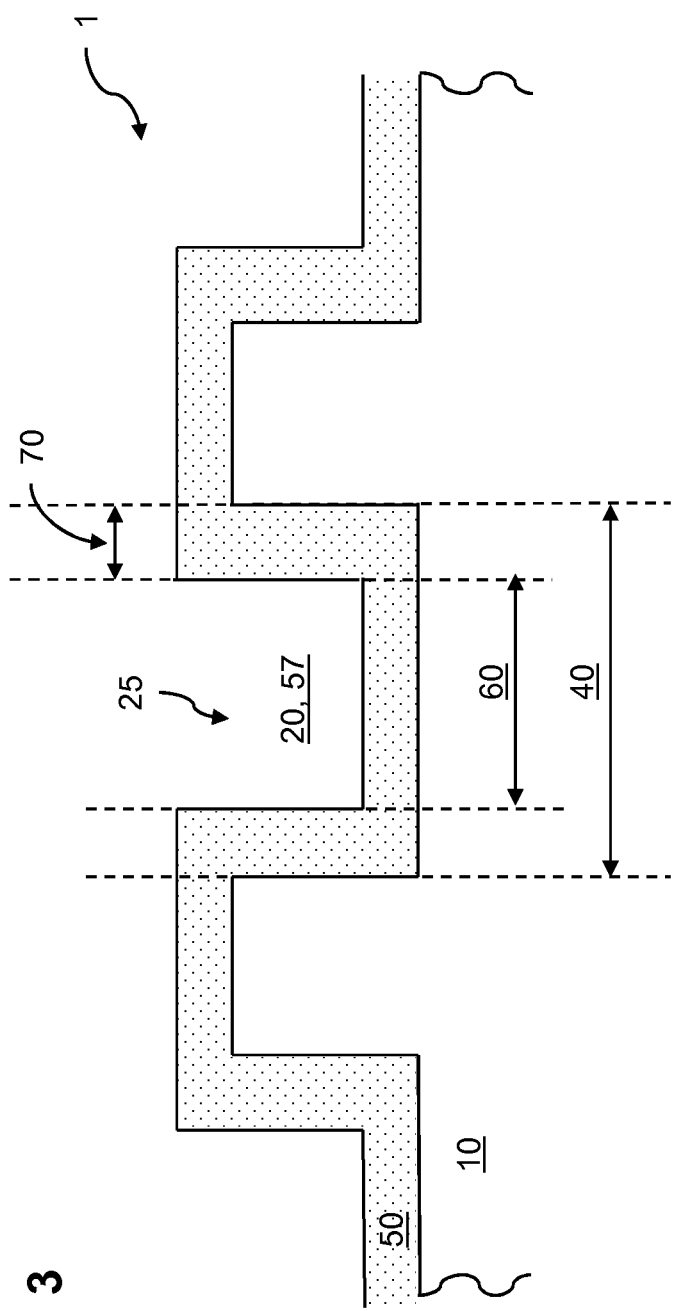
Figure 4:
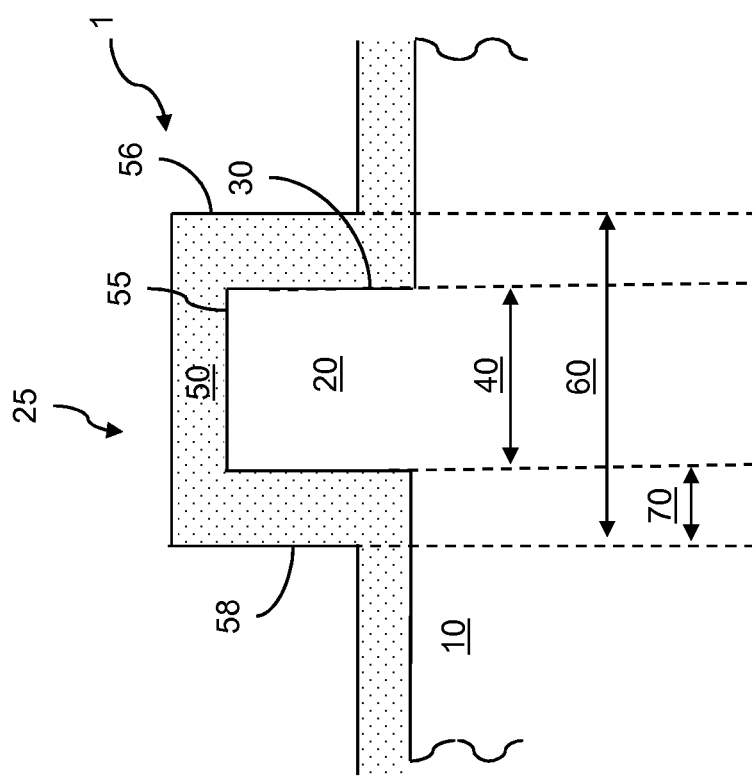
FIG. 4 shows an IC chip in accordance with an embodiment of the invention.

With reference to FIGS. 1-4, a method of determining the target thickness of a conformal film layer is illustrated. As shown in FIG. 1, an IC chip 1 is provided. IC chip 1 may include a number of electronic circuits manufactured by lithographic processes or patterned diffusion of trace elements into the surface of a wafer 10 in a conventional manner. In particular, a structure 20 having at least one vertical surface 30 and horizontal surface 55 is formed. In FIG. 1, structure 20 is a trench. In other embodiments, however, structure 20 may be a raised feature such as, for example, a fin or a ridge (FIG. 4). In various other embodiments not shown, structure 20 may be any other type of feature which is symmetrically coated, such that the structure includes dual films measured with a single delta critical dimension (CD) measurement.

Referring back to FIG. 1, a first critical dimension (CD) 40 of structure 20 is measured. This measurement, and others described further herein, may be performed using critical dimension scanning electron microscopy (CD SEM), atomic force microscopy (AFM), or other suitable techniques. In embodiments such as shown in FIGS. 1-3, where structure 20 is a trench, first CD 40 represents the width of the trench as formed, prior to the deposition of any subsequent films or layers. In other embodiments, such as shown in FIG. 4, where structure 20 may be a raised feature, first CD 40 represents the width of the structure 20 prior to the depositing of the first conformal film 50.

Following measurement of first CD 40, a first conformal film 50 may be deposited over structure 20 as shown in FIG. 2, to form coated structure 25. First conformal film 50 is deposited over each of a horizontal surface 55 and a vertical surface 30 of structure 20. As shown in FIG. 2, where structure 20 is a trench, first conformal film 50 may be deposited such that a measurable trench opening 57 remains between vertical sidewalls 56, 58 on an outer surface of coated structure 25, i.e., the trench is not entirely filled during deposition of first conformal film 50. As shown in FIG. 4, in embodiments in which the structure 20 is a raised feature, first conformal film 50 is similarly deposited over each of a horizontal surface 55 and a vertical surface 30 of structure 20, forming coated structure 25.

After deposition of first conformal film 50, a second CD 60 is measured. As shown in FIGS. 2-3, in embodiments in which coated structure 25 is a coated trench, second CD 60 represents a width of the trench opening 57 between vertical sidewalls 56, 58 on an outer surface of first conformal film 50, i.e., second CD 60 represents a width of trench opening 57 in first conformal film 50 (FIG. 2). As noted above, CD 60 measures greater than 0 nm, because first conformal film 50 does not fill trench opening 57. Other units of distance besides nanometers may of course be used as appropriate to the scale of the coated structure 25. In the embodiment shown in FIGS. 2-3, second CD 60 may be smaller than first CD 40. In embodiments such as shown in FIG. 4, in which coated structure 25 is a raised feature, second CD 60 represents a width of coated structure 25, i.e., a distance between vertical sidewalls 56, 58. In this embodiment, second CD 60 may be greater than first CD 40. A difference between first CD 40 and second CD 60 forms the basis for a determination of a target thickness for first conformal film 50.

In particular, as shown in FIG. 3, in various embodiments, the target thickness 70 of first conformal film 50 can be determined using the measurements of first CD 40 and second CD 60 using Equation 1:

$$t=|\tfrac{1}{2}[CD1-CD2]| \qquad \text{Equation 1:}$$

where t=a target thickness 70 of first conformal film 50; CD1=first CD 40; and CD2=second CD 60. Thus, target thickness 70 of first conformal film 50 is equal to the absolute value of one half the difference between first CD 40 and second CD 60.

In further embodiments, the target thickness 70 of first conformal film 50 can be determined with greater precision, taking into account uncertainties associated with the measurements of each of the first CD 40 and second CD 60. Each measurement, e.g., of first CD 40 and second CD 60, has an associated uncertainty regarding the precision of the measurement. In such an embodiment, the target thickness 70 of first conformal film 50 is determined according to Equation 2:

$$t=|\tfrac{1}{2}[CD1-CD2\pm\sqrt{(\delta_1^2+\delta_2^2)}]| \qquad \text{Equation 2:}$$

where t=a target thickness 70 of first conformal film 50; CD1=first CD 40; and CD2=second CD 60; $\delta_1$=an uncertainty associated with the measurement of CD1; and $\delta_2$=an uncertainty associated with the measurement of CD2. As in Equation 1, target thickness 70 of first conformal film 50 is equal to the absolute value of one half the difference between first CD 40 and second CD 60, however, in Equation 2, the difference between first CD 40 and second CD 60 is ± one half of $\sqrt{(\delta_1^2+\delta_2^2)}$, thus accounting for a uncertainty in the measurements of t while reducing it by half.

Use of this formula to determine target thickness 70 of first conformal film 50 facilitates a determination which is subject to half the uncertainty that would typically be accorded to such a target thickness 70 calculation due to the dual sidewall coating inherent in a conformal film coating.

In various embodiments, after target thickness 70 of first conformal film 50 is determined, target thickness 70 may be adjusted either through further deposition or removal of a partial thickness of first conformal film 50. In other embodiments, the determined target thickness 70 will provide process control and feedback regarding the deposition process, and may be fed forward to subsequent measurements. Hybrid metrology takes advantage of prior knowledge of thickness of first conformal film 50 to reduce computational complexity relative to having an unknown thickness of first conformal film 50 in scatterometry, atomic force microscopy, etc., and processing steps including compensations for films which are too thin or too thick.

Figure 5:
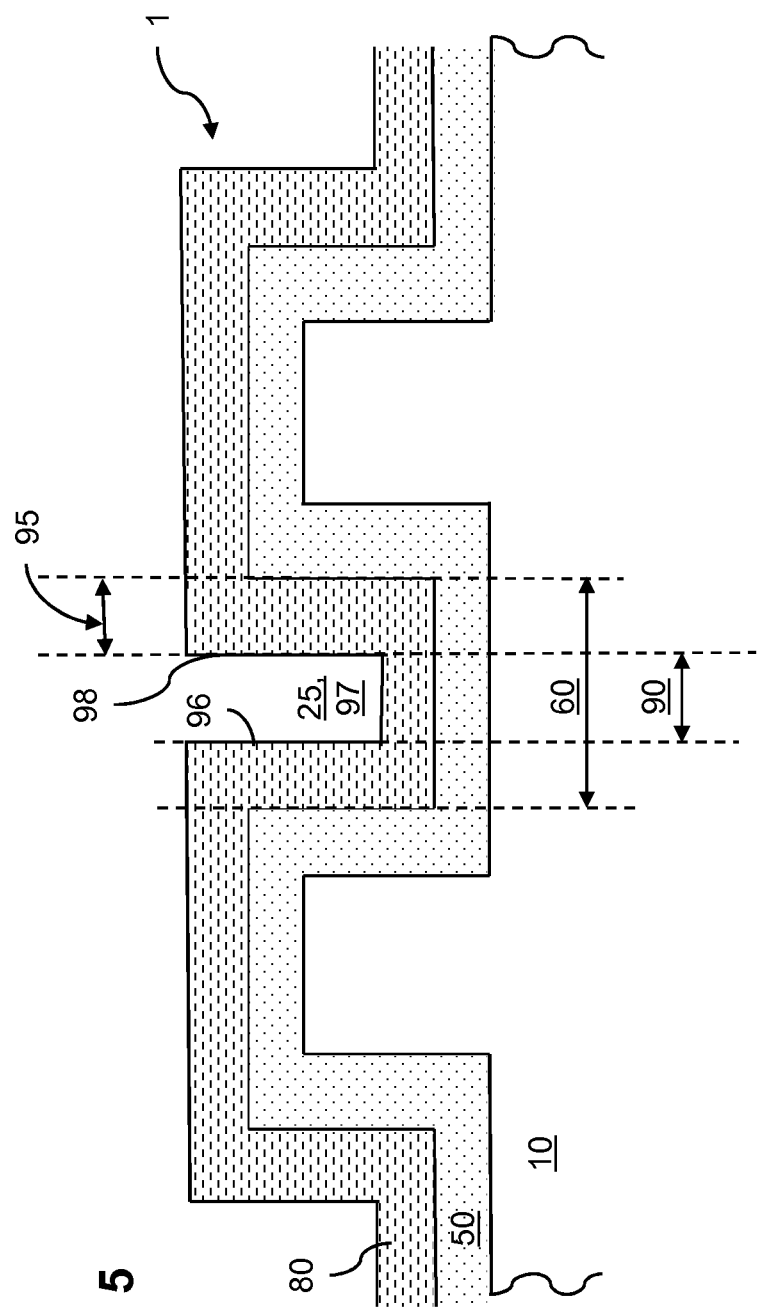
FIGS. 5-6 show IC chips in accordance with further embodiments of the invention.

In further embodiments, as shown in FIG. 5, the above process can be repeated to determine a target thicknesses 95 of subsequently deposited second conformal film 80. For example, after measuring the second CD 60 of coated structure 25, a second conformal film 80 may be deposited over coated structure 25, including structure 20 and first conformal film 50. Second conformal film 80 covers each of a horizontal and a vertical surface of coated structure 25, in a manner similar to first conformal film 50 covering structure 20. In embodiments such as FIG. 5, in which coated structure 25 is a coated trench, a measurable space 97 remains between vertical sidewalls 96, 98 on an outer surface of first conformal film 80, within the coated trench.

Figure 6:
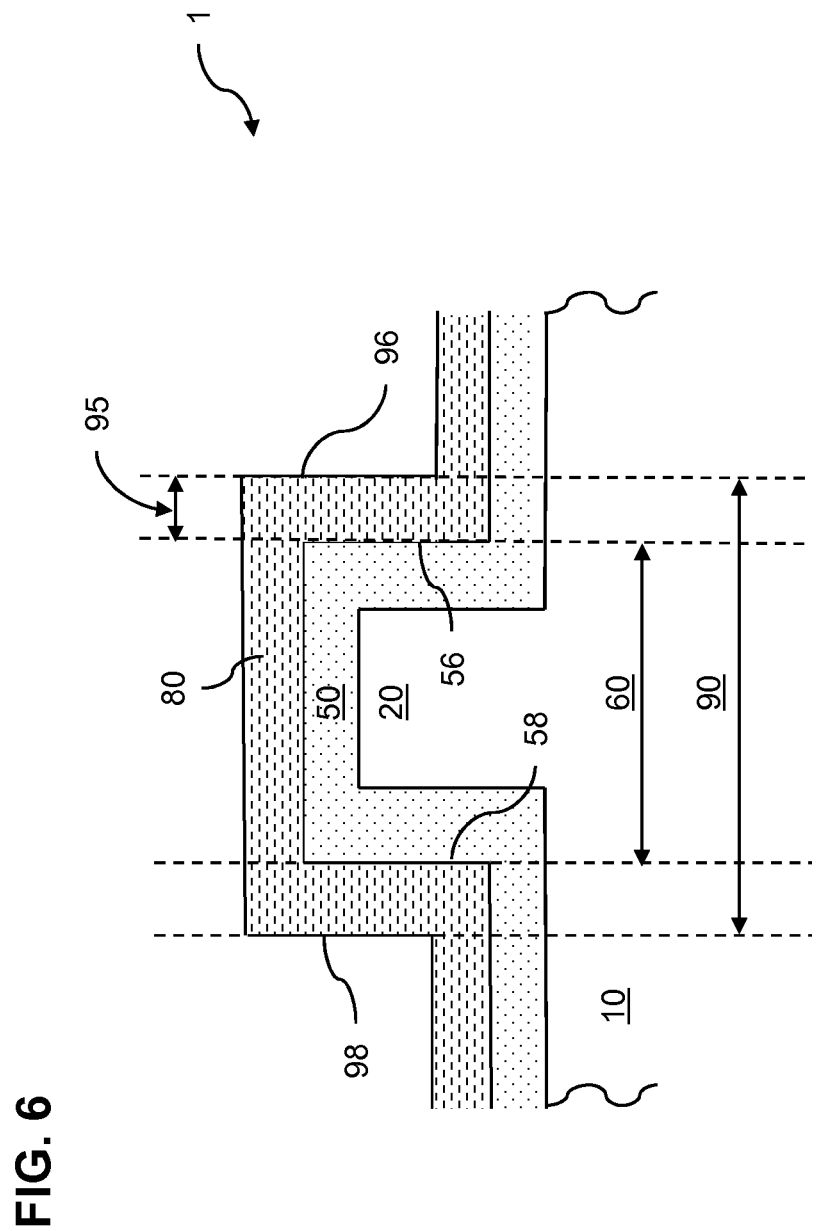

After deposition of second conformal film 80, a third CD 90 is measured. As shown in FIG. 5, in embodiments in which coated structure 25 is a coated trench, third CD 90 represents a width of space 97 between vertical sidewalls 96, 98 on an outer surface of first conformal film 80 in the trench. Third CD 90 measures greater than 0 nm; as with second CD 60, other units of distance may of course be used as appropriate to the scale of the coated structure 25. In embodiments such as shown in FIG. 6, in which structure 20 is a raised feature, second CD 60 represents a width of the structure as coated by first conformal film 50, i.e., a distance between vertical sidewalls 56, 58. Third CD 90 represents a width of coated structure 25 as coated by first conformal film 80, i.e., a distance between vertical sidewalls 96, 98. A difference between second CD 60 and third CD 90 form the basis for a determination of a second target thickness 95 for second conformal film 80.

In particular, as shown in FIGS. 5-6, in various embodiments, the target thickness 95 of second conformal film 80 can be determined using the measurements of second CD 60 and third CD 90 using Equation 3:

$$t_2=|\tfrac{1}{2}[CD2-CD3\pm\sqrt{(\delta_2^2+\delta_3^2)}]| \qquad \text{Equation 3:}$$

where $t_2$=second target thickness 95 of second conformal film 80; CD2=second CD 60; CD3=third CD 90; $\delta_2$=an uncertainty associated with a measurement of CD2; and $\delta_3$=an uncertainty associated with a measurement of CD3.

Figure 7:
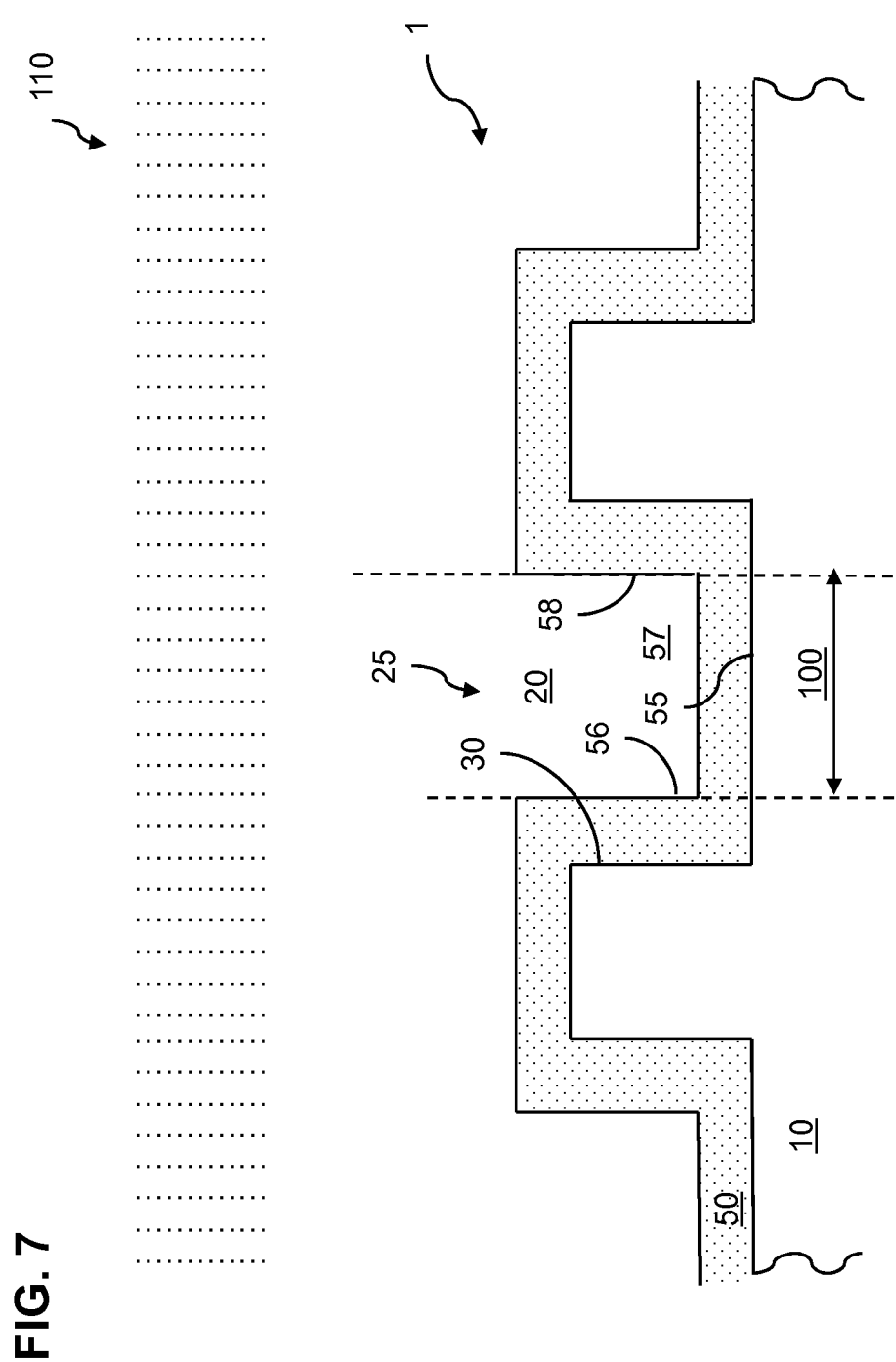

The foregoing methods may further be applied to etching processes in addition to depositions of conformal films 50, 80 in order to determine target thicknesses. In such embodiments, as shown in FIG. 7, a first conformal film 50 may be disposed over a wafer 10 having a structure 20 thereon, forming coated structure 25. Structure 20 may have at least one vertical surface 30 and at least one horizontal surface 55 as described above. A first CD 100 of the coated structure 25 may be measured as described above. For example, CD SEM or AFM techniques may be used. First CD 100 represents the width of the trench opening 57 between vertical side walls 56, 58 of first conformal layer 50. An etch 110 may then be performed to remove at least a partial thickness of the first conformal film 50 from the horizontal 55 and vertical surfaces 30 of structure 20. Various techniques, including reactive ion etching (RIE), focused ion beam (FIB) milling, wet chemistry etching, and others that will be known to those skilled in the art, may be used.

Turning to FIG. 8, second CD 120 may then be measured. Where, as in FIG. 8, structure 20 is a trench, second CD 120 may be larger than first CD 100. Where structure 20 is a raised structure (similar to that of FIG. 4), the opposite may be the case. A target thickness 130 of first conformal film 50 may then be determined based on first CD 100 and the second CD 120 in a fashion similar to that described above, e.g., according to one of Equations 1 or 2. Additionally, the method described with regard to FIGS. 7-8 may be performed on successive layers/films similar to the description accompanying FIGS. 5-6.

The disclosure further provides an integrated circuit (IC) chip produced according to the previously described methods.

With reference to FIGS. 2-3, in an embodiment, IC chip 1 includes a wafer 10, and at least one structure 20 formed on the wafer 10, the structure 20 having at least one vertical surface 30. Structure 20 may be a trench, as in FIG. 3, or a raised feature such as a raised fin or ridge, as in FIG. 4. A first conformal film 50 is disposed over the wafer 10 including the at least one structure 20, wherein the first conformal film 50 has a first target thickness 70. Collectively, structure 20 and first conformal film 50 may be referred to as coated structure 25. First target thickness 70 of first conformal film 50 may be determined according to one of Equations 1 or 2, described above. In further embodiments, a second conformal film 80 may be disposed above first conformal film 50, having target thickness 95. Target thickness 95 may be determined according to Equation 3, described above.

As used herein, the terms "first," "second," and the like, do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to about 25 mm, or, more specifically, about 5 mm to about 20 mm," is inclusive of the endpoints and all intermediate values of the ranges of "about 5 mm to about 25 mm," etc.).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) chip comprising:
    a wafer;
    at least one structure having at least one vertical surface and at least one horizontal surface, the at least one structure being disposed on the wafer; and
    a first conformal film over the wafer including the at least one vertical surface and the at least one horizontal surface of the at least one structure, wherein the first conformal film has a first target thickness, an altered first target thickness and a desired thickness, and wherein the first target thickness is represented by the following equation:

$$t=|\tfrac{1}{2}[CD1-CD2]|$$

where
    t=the first target thickness;
    CD1=a first critical dimension (CD) of the structure without the first conformal film; and
    CD2=a second CD of the first conformal film over the structure,
    wherein the first target thickness is approximately less than the desired target thickness and is configured to be altered by an added amount of the first conformal film; and
    wherein the altered target thickness of the first conformal film is approximately equal to the desired thickness of the first conformal film.

2. The IC chip of claim 1,
    wherein the structure is a trench,
    wherein the first CD is a width of the trench, and
    wherein the second CD is a width of a trench opening in the first conformal film.

3. The IC chip of claim 1,
    wherein the structure is a raised feature, and the raised feature is one of a fin or a ridge,
    wherein the first CD is a width of the raised feature, and
    wherein the second CD is a combined width of the raised feature and the first conformal film over the raised feature.

4. The IC chip of claim 1, wherein the first target thickness accounts for an uncertainty associated with each of the first CD and the second CD, wherein the first target thickness is further represented by the equation, $$t=|\tfrac{1}{2}[CD1-CD2\pm\sqrt{(\delta_1^2+\delta_2^2)}]|$$

where
    t=first-target thickness;
    CD1=the first CD;
    CD2=the second CD;
    $\delta_1$=an uncertainty associated with a measurement of CD1; and
    $\delta_2$=an uncertainty associated with a measurement of CD2.

5. The IC chip of claim 2, wherein the at least one vertical surface includes a sidewall of the trench and the at least one horizontal surface includes a bottom surface of the trench.

6. The IC chip of claim 3, wherein the at least one vertical surface includes a sidewall of the raised structure and the at least one horizontal surface includes a top surface of the raised structure.

7. The IC chip of claim 1, further comprising:
    a second conformal film over the wafer including the at least one vertical surface and at least one horizontal surface of the at least one structure, wherein the second conformal film has a second target thickness, and wherein the second target thickness is represented by the following equation:

$$t_2=|\tfrac{1}{2}[CD2-CD3]|$$

where
    $t_2$=the second target thickness;
    CD2=the second CD; and
    CD3=a third CD.

8. An integrated circuit (IC) chip comprising:
    a wafer;
    at least one structure having at least one vertical surface and at least one horizontal surface, the at least one structure being disposed on the wafer; and a first conformal film over the wafer including the at least one vertical surface and the at least one horizontal surface of the at least one structure, wherein the first conformal film has a first target thickness, a desired thickness and an altered first target thickness, and wherein the first target thickness is represented by the following equation:

$$t=|\tfrac{1}{2}[CD1-CD2]|$$

where
t=the first target thickness;
CD1=a first critical dimension (CD) of the structure without the first conformal film; and
CD2=a second CD of the first conformal film over the structure,
wherein the first target thickness is approximately larger than the desired thickness and is configured to be altered by a subtracted amount of at least a partial thickness of the first conformal film; and
wherein the altered target thickness of the first conformal film is approximately equal to the desired thickness of the first conformal film.

9. The IC chip of claim 8,
wherein the structure is a trench,
wherein the first CD is a width of the trench, and
wherein the second CD is a width of a trench opening in the first conformal film.

10. The IC chip of claim 8,
wherein the structure is a raised feature, and the raised feature is one of a fin or a ridge,
wherein the first CD is a width of the raised feature, and
wherein the second CD is a combined width of the raised feature and the first conformal film over the raised feature.

11. The IC chip of claim 8, wherein the first target thickness accounts for an uncertainty associated with each of the first CD and the second CD, wherein the first target thickness is further represented by the equation, $$t=|\tfrac{1}{2}[CD1-CD2\pm\sqrt{(\delta_1^2+\delta_2^2)}]|$$

where
t=first target thickness;
CD1=the first CD;
CD2=the second CD;
$\delta_1$=an uncertainty associated with a measurement of CD1; and
$\delta_2$=an uncertainty associated with a measurement of CD2.

12. The IC chip of claim 9, wherein the at least one vertical surface includes a sidewall of the trench and the at least one horizontal surface includes a bottom surface of the trench.

13. The IC chip of claim 10, wherein the at least one vertical surface includes a sidewall of the raised structure and the at least one horizontal surface includes a top surface of the raised structure.

14. The IC chip of claim 8, further comprising:
a second conformal film over the wafer including the at least one vertical surface and at least one horizontal surface of the at least one structure, wherein the second conformal film has a second target thickness, and wherein the second target thickness is represented by the following equation:

$$t_2=|\tfrac{1}{2}[CD2-CD3]|$$

where
$t_2$=the second target thickness;
CD2=the second CD; and
CD3=a third CD.

* * * * *